United States Patent
Park

(10) Patent No.: US 9,088,286 B2
(45) Date of Patent: Jul. 21, 2015

(54) METHOD AND APPARATUS FOR DETECTING CUT-OFF FREQUENCY OF PULSE SIGNAL

(71) Applicant: LSIS CO., LTD., Anyang-si, Gyeonggi-do (KR)

(72) Inventor: Kang Hee Park, Cheonan-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 56 days.

(21) Appl. No.: 13/975,032

(22) Filed: Aug. 23, 2013

(65) Prior Publication Data

US 2014/0098927 A1 Apr. 10, 2014

(30) Foreign Application Priority Data

Oct. 5, 2012 (KR) .......................... 10-2012-0110702

(51) Int. Cl.
| | |
|---|---|
| *G01R 23/02* | (2006.01) |
| *H03K 21/40* | (2006.01) |
| *H03K 5/19* | (2006.01) |
| *H03K 5/26* | (2006.01) |
| *H03K 21/38* | (2006.01) |
| *G01R 23/15* | (2006.01) |
| *G01R 23/10* | (2006.01) |

(52) U.S. Cl.
CPC .................. *H03K 21/40* (2013.01); *H03K 5/19* (2013.01); *H03K 5/26* (2013.01); *G01R 23/10* (2013.01); *G01R 23/15* (2013.01); *H03K 21/38* (2013.01)

(58) Field of Classification Search
None
See application file for complete search history.

(56) References Cited

U.S. PATENT DOCUMENTS

| | | | | |
|---|---|---|---|---|
| 4,360,782 A | * | 11/1982 | Nowell | 327/48 |
| 4,612,657 A | * | 9/1986 | Takahashi | 377/32 |
| 4,672,556 A | * | 6/1987 | Shepler | 702/78 |
| 4,783,622 A | * | 11/1988 | Honjo et al. | 324/76.61 |
| 5,159,615 A | * | 10/1992 | Clark | 377/56 |
| 5,206,549 A | * | 4/1993 | Suzuki et al. | 327/40 |
| 5,657,361 A | * | 8/1997 | Inagaki et al. | 377/39 |
| 6,058,187 A | * | 5/2000 | Chen | 713/170 |
| 6,148,055 A | * | 11/2000 | Sakai et al. | 377/28 |

(Continued)

FOREIGN PATENT DOCUMENTS

| | | |
|---|---|---|
| JP | 01-145580 | 6/1989 |
| JP | 05-203685 | 8/1993 |

(Continued)

OTHER PUBLICATIONS

Japan Patent Office Application Serial No. 2013-195388, Office Action dated Aug. 29, 2014, 3 pages.

*Primary Examiner* — Tuan T Lam
(74) *Attorney, Agent, or Firm* — Lee, Hong, Degerman, Kang & Waimey

(57) ABSTRACT

Disclosed is a apparatus and method for detecting a cut-off frequency of a pulse signal, the apparatus including an input processor configured to generate a second pulse signal at a time when a rising edge and a falling edge of a first pulse signal appear, in a case the first pulse signal, which is a pulse signal of a monitoring object, is inputted, a counter configured to count a clock signal relative to the second pulse signal generated by the input processor, a reset processor configured to reset the counter at every predetermined (set) period, and a detector configured to generate and output a cut-off frequency of a detection signal, in a case an output value of the counter exceeds a predetermined (set) threshold during the predetermined period.

8 Claims, 7 Drawing Sheets

(56) References Cited

U.S. PATENT DOCUMENTS

| | | | | |
|---|---|---|---|---|
| 6,316,929 | B1 * | 11/2001 | Yamaguchi | 324/76.53 |
| 6,597,205 | B2 * | 7/2003 | Powell et al. | 327/48 |
| 7,471,117 | B2 * | 12/2008 | Chen et al. | 327/47 |
| 8,644,447 | B2 * | 2/2014 | Prakash et al. | 377/47 |

FOREIGN PATENT DOCUMENTS

| | | |
|---|---|---|
| JP | 07-235831 | 9/1995 |
| JP | 07-294565 | 11/1995 |
| JP | 09-018306 | 1/1997 |
| JP | 2002-232406 | 8/2002 |

* cited by examiner

METHOD AND APPARATUS FOR DETECTING CUT-OFF FREQUENCY OF PULSE SIGNAL

CROSS-REFERENCE TO RELATED APPLICATION

Pursuant to 35 U.S.C. §119(a), this application claims the benefit of earlier filing date and right of priority to Korean Application Number 10-2012-0110702, filed on Oct. 5, 2012, the contents of which are hereby incorporated by reference in their entirety.

BACKGROUND OF THE INVENTION

1. Field of the Invention

Exemplary embodiments of the present disclosure relate to an apparatus for detecting a cut-off frequency of a pulse signal, and a method thereof, and more particularly to an apparatus for detecting a cut-off frequency of a pulse signal configured to detect a frequency of a pulse signal, in a case a frequency of an inputted pulse signal rises above a maximum rated speed, and a method thereof.

2. Description of Related Art

A problem occurs, in a case a frequency of a pulse signal rises above a maximum rated speed in a case a pulse signal generated from an encoder or a pulse generator is processed. To be more specific, a high speed counter module of a PLC (Programmable Logic Controller) functions to count a fast pulse signal of a pulse generator or an encoder that cannot be counted by a general counter instruction.

FIG. 1 is a block diagram illustrating a high speed counter module according to prior art. A high speed counter module (12) of FIG. 1 includes a buffer (12-1), an MPU (Micro Process Unit, 12-2) and an input circuit (12-3).

The input circuit (12-3) converts a high speed pulse train generated by an encoder (13) to a CMOS level and transmits it to the MPU (12-2), where the MPU (12-2) adds or deducts a buffer (12-1) value from a rising edge or a falling edge of an inputted pulse signal. A management unit (11) including a PC (Personal Computer) or an HMI (Human Machine Interface) reads the buffer (12-1) value of the high speed counter module (12) and displays it on a screen.

FIG. 2 is a schematic view illustrating a process in a case a pulse train (string) is inputted to an input contact point of the high speed counter module (12) according to prior art.

The MPU (12-2) repetitively processes a user program (scan program) (S22) after initializing an I/O (Input/Output) and a memory (S21). That is, the MPU (12-2) executes a PLC scan program (S23), communicates with the management unit (11) and updates an input/output contact point (S25).

Whenever the rising/falling edges of the input signal are detected during these processes, the PLC scan program is stopped to generate an interrupt signal, and a high speed counter process routine is performed.

However, the method of performing the high speed counter function after interrupting the PLC scan program and generating interrupt whenever the signal inputted to an interrupt port rises (1, 3) or falls (2, 4) suffers from many disadvantages.

That is, interrupts may be continuously accumulated to greatly slow or stop the scan program performance, if an edge occurrence period (Tin) of an input pulse train is shorter (if a maximum input speed is exceeded) than a maximum interrupt enabling time (T). Although the MPU (12-2) may measure the number of the pulse inputs accumulated during a predetermined unit time and check if a set maximum input allowable speed has been exceeded in order to prevent this phenomenon, this process suffers from disadvantages in that an additional routine for measuring the number of accumulated pulses whenever the interrupt is processed to increase each interrupt process time and to decrease the performance of high speed counter module.

SUMMARY OF THE INVENTION

Exemplary aspects of the present disclosure are to substantially solve at least the above problems and/or disadvantages and to provide at least the advantages as mentioned below. Thus, the present disclosure is directed to provide an apparatus for detecting a cut-off frequency of a pulse signal configured to detect a cut-off frequency of a pulse signal, in a case a frequency of an inputted pulse signal exceeds a maximum rated speed due to various reasons including noises generated by a system environment or an encoder, or system design error, and a method thereof.

In one general aspect of the present disclosure, there is provided an apparatus for detecting a cut-off frequency of a pulse signal, the apparatus comprising:

an input processor configured to generate a second pulse signal at a time when a rising edge and a falling edge of a first pulse signal appear, in a case the first pulse signal, which is a pulse signal of a monitoring object, is inputted;

a counter configured to count a clock signal relative to the second pulse signal generated by the input processor;

a reset processor configured to reset the counter at every predetermined (set) period; and a detector configured to generate and output a cut-off frequency of a detection signal, in a case an output value of the counter exceeds a predetermined (set) threshold during the predetermined period.

In some exemplary embodiments, the input processor may include a buffer configured to delay the first pulse signal, and an XOR processor configured to output the second pulse signal by performing an XOR (Exclusive OR) operation on the first pulse signal and the signal delayed by the buffer.

In some exemplary embodiments, the reset processor may include an oscillator configured to generate a pulse signal of a predetermined period, an inverter configured to output a predetermined (set) period-delayed signal by reversing the pulse signal generated by the oscillator, and an AND processor configured to perform an AND operation on the pulse signal generated by the oscillator and the output signal of the inverter and to supply an operation value to a reset terminal of the counter.

In some exemplary embodiments, the detector may include an AND processor configured to output a cut-off frequency of a detection signal by performing an AND operation on an output value of the counter.

In another general aspect of the present disclosure, there is provided a method for detecting a cut-off frequency of a pulse signal, the method comprising:

generating a second pulse signal at a time when a rising edge and a falling edge of a first pulse signal appear, in a case the first pulse signal, which is a pulse signal of a monitoring object, is inputted;

counting a clock signal relative to the generated second pulse signal using a counter;

generating a cut-off frequency of a detection signal, in a case a count value relative to the clock signal counted by the counter exceeds a predetermined (set) threshold during a predetermined (set) period; and re-setting the counter for counting the clock signal at every predetermined (set) period.

In some exemplary embodiments, the step of generating the second pulse signal may include outputting a signal in which the first pulse signal is delayed by a buffer; and outputting the second pulse signal by performing an XOR (Exclusive OR) operation on the first pulse signal and the signal delayed by the buffer.

In some exemplary embodiments, the resetting step may include generating a pulse signal of a predetermined (set) period, outputting a predetermined (set) period-delayed signal by reversing the generated pulse signal, and outputting an AND operation value by performing an AND operation on the generated pulse signal and the delayed pulse signal.

In some exemplary embodiments, the step of generating the detection signal of the cut-off frequency may include generating a detection signal of cut-off frequency by performing an AND operation on the counted value outputted by the counter.

In an advantageous aspect, a cut-off frequency of a detection signal can be outputted by automatically detecting a pulse train over a maximum rated speed is applied, in a case the pulse train over the maximum rated speed is applied.

Various apparatus including a high speed counter module of a PLC configured to process a pulse signal can monitor whether a pulse signal exceeding a maximum rated speed is inputted using the cut-off frequency of the detection signal, and as a result, an adequate action can be taken including performance of a temporary stop of operation and generation of a warning.

Hence, stability of an apparatus processing a pulse signal can be enhanced and an easy application is enabled, because a simple logic circuit is used and realized.

DETAILED DESCRIPTION OF THE INVENTION

Now, the exemplary embodiments of the present disclosure will be described in detail with reference to the accompanying drawings.

Figure 1:
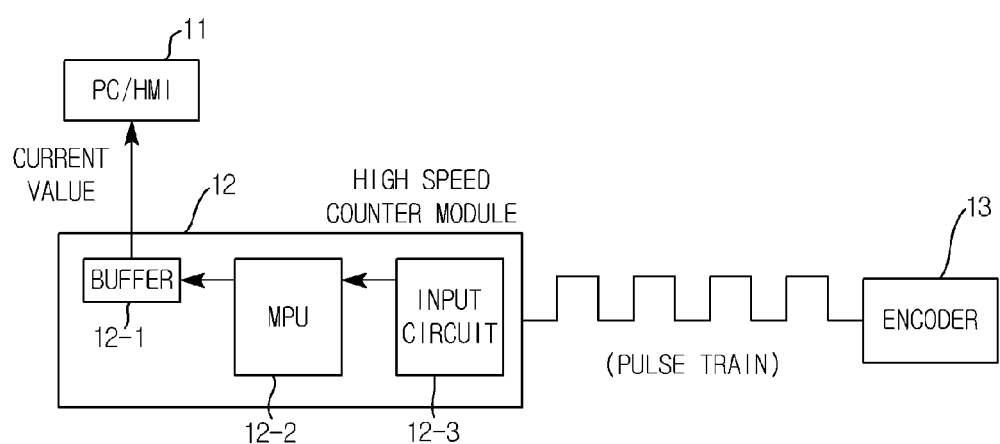
FIG. 1 is a block diagram illustrating a high speed counter module of a PLC according to an exemplary embodiment of prior art.
Figure 2:
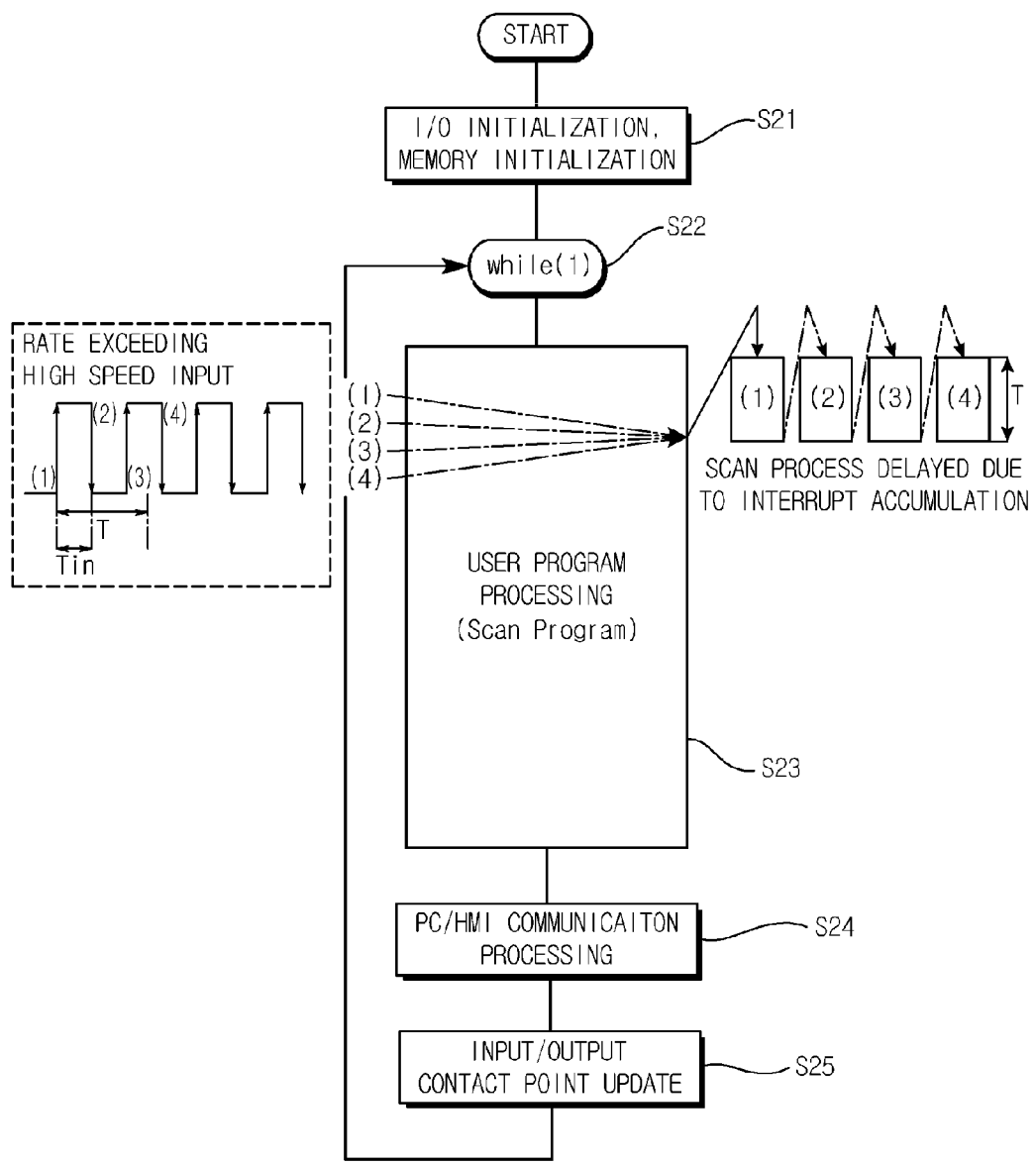
FIG. 2 is a schematic view illustrating an operation of a high speed counter module according to prior art.
Figure 3:
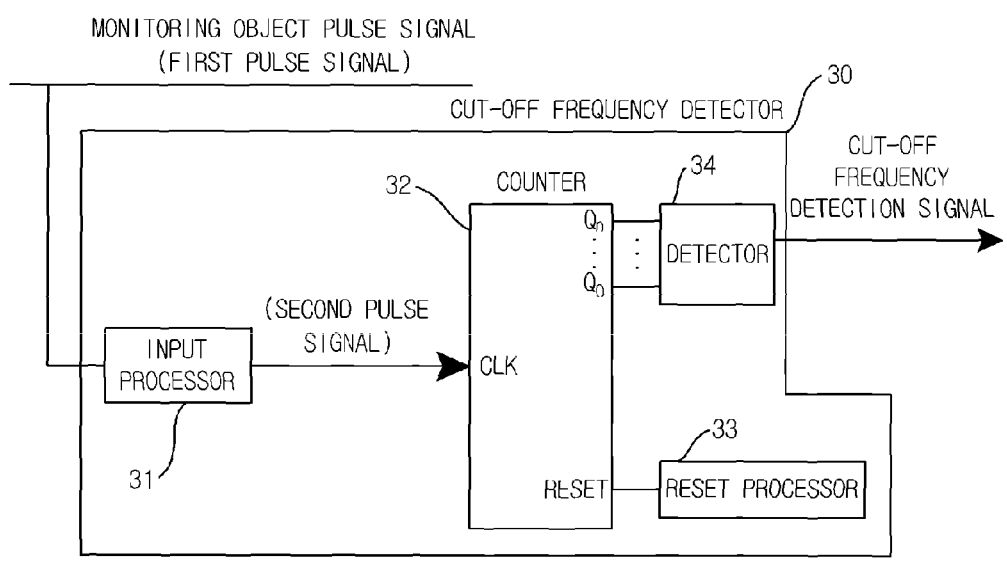
FIG. 3 is a schematic view illustrating a configuration of an apparatus for detecting a cut-off frequency according to the present disclosure.

FIG. 3 is a schematic view illustrating a configuration of an apparatus for detecting a cut-off frequency according to the present disclosure.

Referring to FIG. 3, an apparatus (30) for detecting a cut-off frequency (hereinafter referred to as 'apparatus') according to the present disclosure may include an input processor (31), a counter (32), a reset processor (33) and a detector (34).

The input processor (31) functions to generate a pulse signal at a point where a rising edge and a falling edge of monitoring object pulse signal appear. For convenience sake, the monitoring object pulse signal is hereinafter referred to as a first pulse signal, and another pulse signal generated by the input processor (31) is referred to as a second pulse signal.

The counter (32) functions to receive, as a clock signal, the second pulse signal generated by the input processor (31) and count the inputted clock signal. That is, the counter (32) counts a point where a rising edge and a falling edge of the first pulse signal appear.

The reset processor (33) functions to generate a reset signal at every period (Trst) to reset the counter (32). Furthermore, in a case an output value counted by the counter (32) during the period (Trst) in response to the reset signal of the reset processor (33) exceeds a predetermined value, the detector (34) functions to output a cut-off frequency detection signal that notifies that the output value exceeds the predetermined value.

That is, in a case more than a predetermined number of second pulse signals are generated during the predetermined period (Trst), the detector (34) outputs a detection signal thereto, because it means that the first pulse signal is inputted at a speed higher than a preset maximum rated speed. Now, a detailed exemplary embodiment of the apparatus of the present disclosure will be described with reference to FIG. 4.

Figure 4:
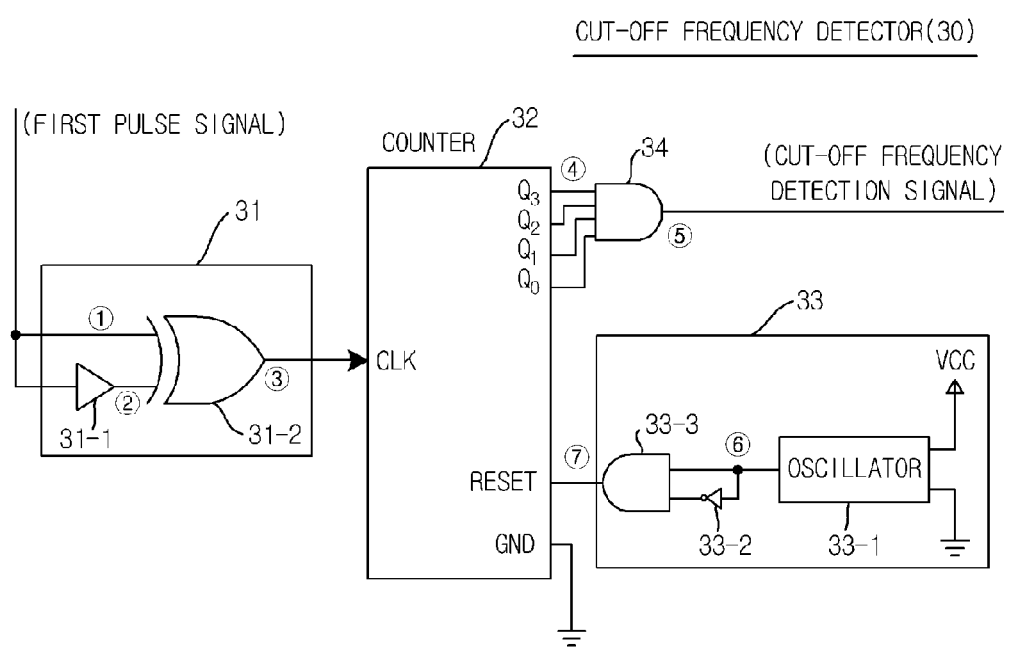
FIG. 4 is a schematic view illustrating a detailed circuit configuration of an apparatus for detecting a cut-off frequency according to the present disclosure.

FIG. 4 is a schematic view illustrating a detailed circuit configuration of an apparatus for detecting a cut-off frequency according to the present disclosure.

Referring to FIG. 4, the input processor (31) may include a first pulse signal, and an XOR operator (31-2) performing an XOR on a signal delayed by a buffer (31-1), where the signal outputted by the XOR processor (operator, 31-2) is inputted to the counter (32) as a second pulse signal.

The reset processor (33) may include an oscillator (33-1) generating a pulse signal of a predetermined period, an inverter (33-2) delaying the pulse signal outputted by the oscillator (33-1) by reversing the pulse signal, and an AND operator (33-3) performing an AND operation on the output signals of the oscillator (33-1) and the inverter (33-2).

An output of the reset processor (33) is connected to a reset terminal of the counter (32), and the counter (32) is reset in a case an output signal of the reset processor (33) is in a high state.

The detector (34) may include an AND operator (34) performing an AND operation on a value outputted from an output terminal (Q0-Qn) of the counter (32) and outputting the value. For example, in a case an output of the counter (32) is 4 (four) bits, the detector (34) outputs a cut-off frequency detection signal of high state, in a case four output values are all in a high state. Q3

Figure 5:
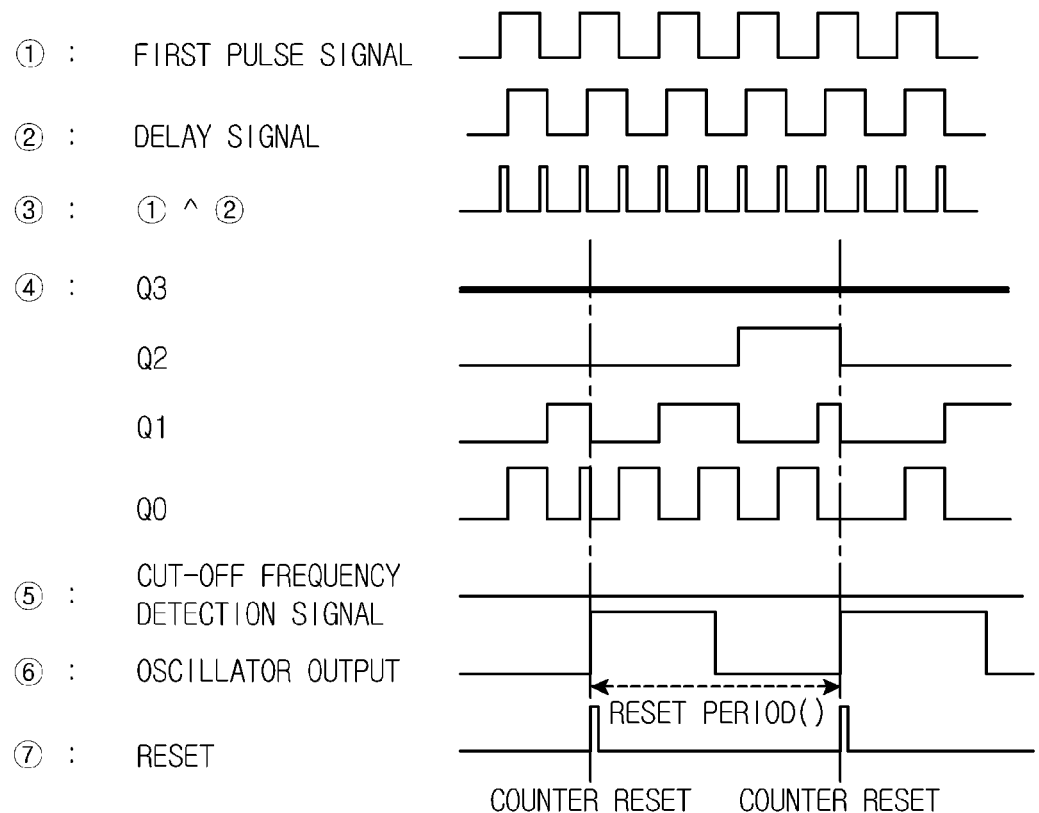
FIG. 5 is a timing chart when a frequency of a first pulse signal illustrated in FIG. 4 is normal.
Figure 6:
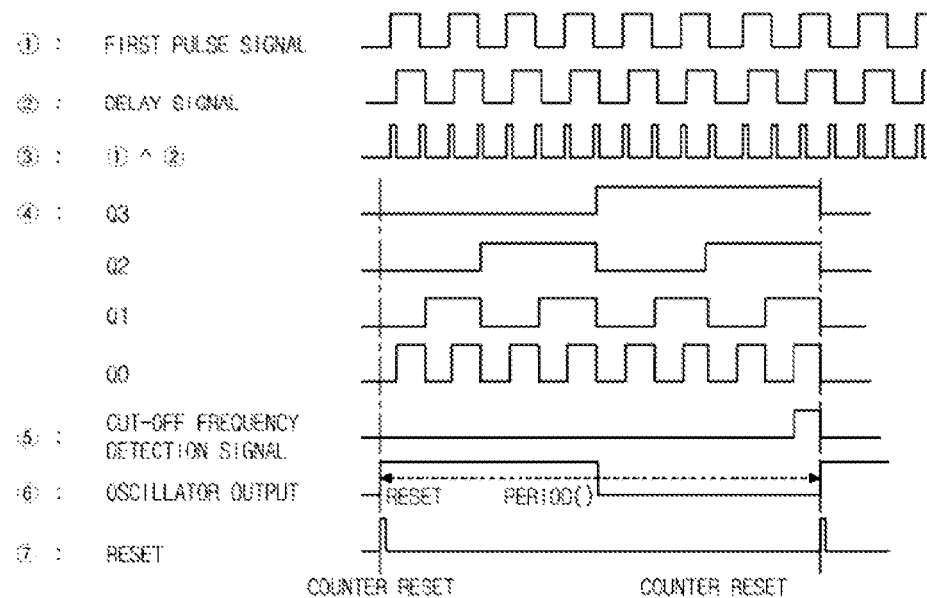
FIG. 6 is a timing chart when a frequency of a first pulse signal illustrated in FIG. 4 is inputted fast enough to exceed a cut-off frequency.

Now, an operation process will be described with reference to FIGS. 4 and 5, where FIG. 5 is a timing chart when a frequency of a first pulse signal illustrated in FIG. 4 is normal, and FIG. 6 is a timing chart when a frequency of a first pulse signal illustrated in FIG. 4 is inputted fast enough to exceed a cut-off frequency. It should be noted that although description is made with reference to a 4-bit counter, the present disclosure is not limited thereto, and size countable by the counter (32) may be variably configured, if necessary.

Signal ② is generated with a delay by the buffer (31-1) whenever a rising edge or a falling edge of the first pulse signal, which is the monitoring object pulse signal, and signals ① and ② are performed with XOR operation, where a signal ③ is a second pulse signal generated at an instance when all edges appear.

Signal ③ is connected to a clock terminal (CLK) of the counter (32), such that a signal ④ appearing at counter output terminals QO~Q3 is changed whenever a clock signal is inputted. A signal of ⑦ is inputted into a reset terminal (RESET) of the counter (32), and a signal ⑥ generated from the oscillator (33-1) is generated once at each vibration period of the oscillator (33-1) through the inverter (33-2) and the AND operator (33-3), where signal ④ appearing at the output terminals QO~Q3 of the counter (32) are initialized to zero.

In a case a pulse train (string) faster than a maximum rated speed is inputted into a period (Trst) displayed by a reset signal ⑦ inputted into the reset terminal (RESET) of the counter (32), a cut-off frequency detection signal ⑤ is generated on the 15th second pulse signal due to accumulation of output value of the counter (32) as shown in FIG. 6.

That is, as illustrated in FIG. 5, in a case less than 15 pulses are inputted during the reset period (Trst), the reset signal ⑦ is periodically generated, and values of output terminals QO~Q3 of the counter (32) are initialized to zero, such that the signal ⑤ maintains a low state to prevent a cut-off frequency detection signal from being generated.

However, as illustrated in FIG. 6, in a case more than 15 pulses are inputted during the reset period (Trst), the signal ⑤ is changed to a high state to generate a cut-off frequency detection signal.

The cut-off frequency may be freely set by adjusting the frequency of the oscillator (33-1). For example, if the frequency of the oscillator (33-1) is set at 500 Hz, the reset period (Trst) is 2 ms, and the cut-off frequency is 7.5 kHz where more than 15 pulses are inputted during 2 ms.

Furthermore, if the frequency of the oscillator (33-1) is set at 1 kHz, the reset period (Trst) is 1 ms, and the cut-off frequency is 15 kHz. That is, the cut-off frequency can be freely selected by adjusting the frequency of the oscillator (33-1), whereby application scope is very broad.

Figure 7:
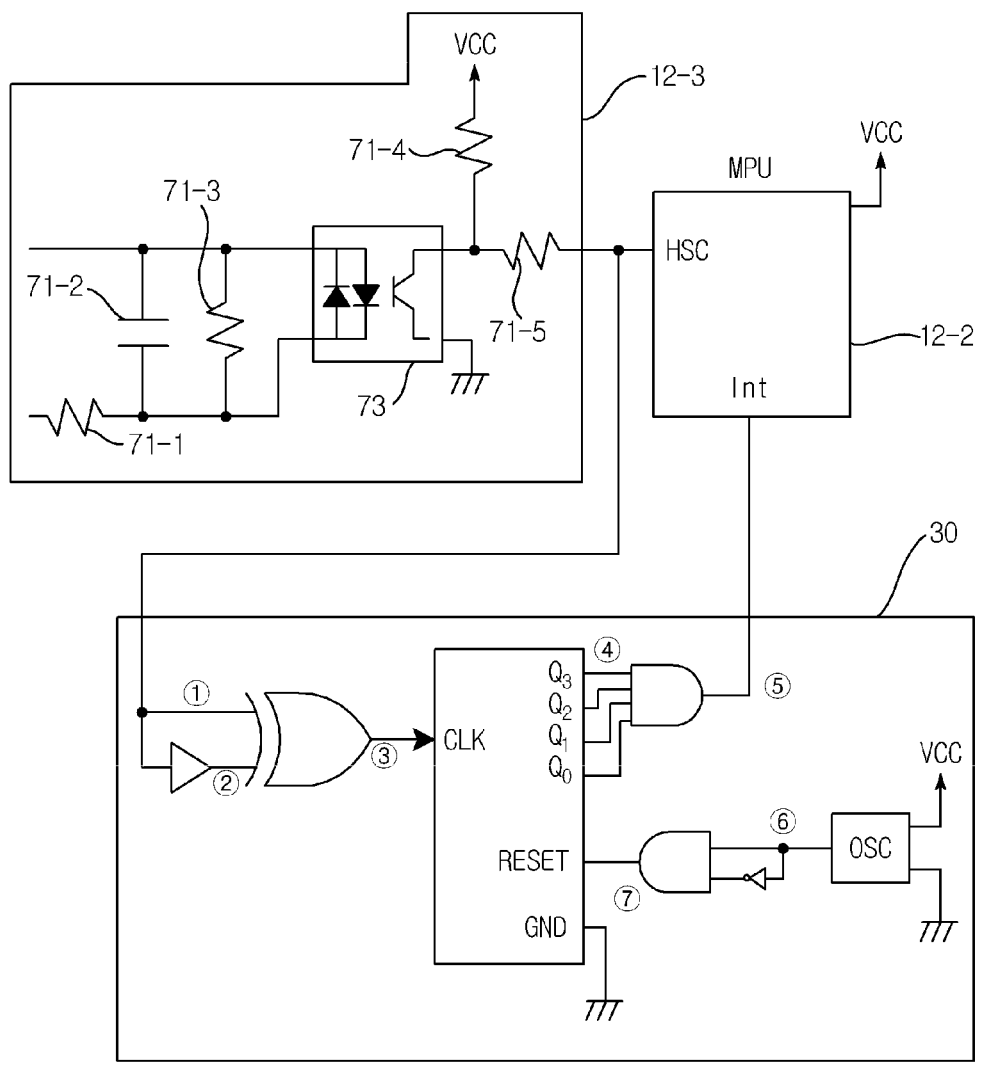
FIG. 7 is a schematic view illustrating an apparatus for detecting a cut-off frequency applied to a high speed counter module of a PLC according to the present disclosure.

FIG. 7 is a schematic view illustrating an apparatus (30) for detecting a cut-off frequency that is applied to a high speed counter module of a PLC according to the present disclosure, where a pulse signal generated from an encoder is processed by an input circuit (12-3) to be inputted into an MPU (Micro Processor Unit, 12-2) as a first pulse signal.

The input circuit (12-3) is inputted into a photo-coupler (73) through resistor elements (71-1, 71-3) and a capacitor (71-2) to be processed in an insulated state, and an output signal of the photo-coupler (73) is outputted as a first pulse signal through resistor elements (71-4, 71-5).

The first pulse signal inputted into the MPU (12-2) is also inputted into the apparatus (30) in parallel, and the apparatus (30), while monitoring the frequency of the first pulse signal, and if a frequency of the first pulse signal exceeds a cut-off frequency, outputs a cut-off frequency detection signal notifying that the frequency of the first pulse signal has exceeded the cut-off frequency.

The cut-off frequency detection signal is inputted into an external interrupt terminal (Int) of the MPU (12-2), where the MPU (12-2) may take actions to counter the generation of external interrupt, if the external interrupt is generated.

For example, a scan program may be temporarily stopped, and a high speed counter interrupt may be processed to return to the scan program, whereby problems can be solved that are generated when a pulse signal faster than a rated speed is inputted due to lengthened or stopped scan program processing time caused by accumulation of interrupts.

Although exemplary embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. An apparatus for detecting a cut-off frequency of a pulse signal, the apparatus comprising:
   an input processor configured to generate a second pulse signal at a time when a rising edge and a falling edge of a first pulse signal appear, in a case the first pulse signal, which is a pulse signal of a monitoring object, is inputted;
   a counter configured to count a clock signal relative to the second pulse signal generated by the input processor;
   a reset processor configured to reset the counter at every predetermined (set) period; and
   a detector configured to generate and output a cut-off frequency of a detection signal, in a case an output value of the counter exceeds a predetermined (set) threshold during the predetermined period.

2. The apparatus of claim 1, wherein the input processor includes a buffer configured to delay the first pulse signal, and an XOR processor configured to output the second pulse signal by performing an XOR (Exclusive OR) operation on the first pulse signal and the signal delayed by the buffer.

3. The apparatus of claim 1, wherein the reset processor includes an oscillator configured to generate a pulse signal of a predetermined period, an inverter configured to output a predetermined (set) period-delayed signal by reversing the pulse signal generated by the oscillator, and an AND processor configured to perform an AND operation on the pulse signal generated by the oscillator and the output signal of the inverter and to supply an operation value to a reset terminal of the counter.

4. The apparatus of claim 1, wherein the detector includes an AND processor configured to output a cut-off frequency of a detection signal by performing an AND operation on an output value of the counter.

5. A method for detecting a cut-off frequency of a pulse signal, the method comprising:
   generating a second pulse signal at a time when a rising edge and a falling edge of a first pulse signal appear, in a case the first pulse signal, which is a pulse signal of a monitoring object, is inputted;
   counting a clock signal relative to the generated second pulse signal using a counter;
   generating a cut-off frequency of a detection signal, in a case a count value relative to the clock signal counted by the counter exceeds a predetermined (set) threshold during a predetermined (set) period; and
   resetting the counter for counting the clock signal at every predetermined (set) period.

6. The method of claim 5, wherein the step of generating the second pulse signal includes outputting a signal in which the first pulse signal is delayed by a buffer; and outputting the second pulse signal by performing an XOR (Exclusive OR) operation on the first pulse signal and the signal delayed by the buffer.

7. The method of claim 5, wherein the resetting step includes generating a pulse signal of a predetermined (set) period, outputting a predetermined (set) period-delayed signal by reversing the generated pulse signal, and outputting an AND operation value by performing an AND operation on the generated pulse signal and the delayed pulse signal.

8. The method of claim 5, wherein the step of generating the detection signal of the cut-off frequency includes generating a detection signal of cut-off frequency by performing an AND operation on the counted value outputted by the counter.

* * * * *